(12) United States Patent
Hagmann

(10) Patent No.: US 7,613,578 B2
(45) Date of Patent: Nov. 3, 2009

(54) METHOD FOR NONINVASIVE DETERMINATION OF A DISTRIBUTION OF ELECTRICAL CURRENT AND APPARATUS FOR THE SAME

(76) Inventor: Mark J. Hagmann, P.O. Box 3863, Salt Lake City, UT (US) 84110

( * ) Notice: Subject to any disclaimer, the term of this patent is extended or adjusted under 35 U.S.C. 154(b) by 0 days.

(21) Appl. No.: 11/759,555

(22) Filed: Jun. 7, 2007

(65) Prior Publication Data

US 2008/0275657 A1 Nov. 6, 2008

Related U.S. Application Data

(60) Provisional application No. 60/915,243, filed on May 1, 2007.

(51) Int. Cl.
*G01R 19/00* (2006.01)
*G01N 27/00* (2006.01)
(52) U.S. Cl. .......................... 702/64; 324/240
(58) Field of Classification Search .................. 702/64, 702/65, 189, 196; 324/219, 230, 240, 318
See application file for complete search history.

(56) References Cited

U.S. PATENT DOCUMENTS

| | | | |
|---|---|---|---|
| 3,395,339 A * | 7/1968 | Brown, Jr. .................. 324/238 |
| 3,434,052 A | 3/1969 | Fechant |
| 3,885,213 A | 5/1975 | Rioux et al. |
| 4,897,600 A | 1/1990 | Hagmann et al. |
| 4,913,153 A | 4/1990 | Hagmann et al. |
| 4,939,465 A * | 7/1990 | Biehl et al. .................. 324/318 |
| 5,414,400 A | 5/1995 | Gris et al. |
| 5,442,280 A | 8/1995 | Baudart |
| 5,767,668 A | 6/1998 | Durand |
| 5,852,395 A | 12/1998 | Bosco et al. |
| 6,043,641 A | 3/2000 | Singer et al. |
| 6,118,270 A | 9/2000 | Singer et al. |
| 6,313,623 B1 | 11/2001 | Kojovic et al. |
| 6,566,854 B1 | 5/2003 | Hagmann et al. |
| 6,624,624 B1 | 9/2003 | Karrer et al. |
| 6,680,608 B2 | 1/2004 | Kojovic |
| 6,822,547 B2 | 11/2004 | Saito et al. |
| 7,106,162 B2 | 9/2006 | Saito |

OTHER PUBLICATIONS

Measurements/ Magnetic field of a toroidal coil/The magnetic field of a solenoid and a toroid-Instructions (3pages, sections 2.1 and 3.1); http://www.fyslab.hut.fi/kurssit/Tfy-3.15xx/Tp-ohjeet/33en.pdf.*

* cited by examiner

*Primary Examiner*—Bryan Bui
(74) *Attorney, Agent, or Firm*—Geoffrey E. Dobbin

(57) ABSTRACT

A method of non-invasive determination of electrical current distribution is disclosed. The method utilizes mathematical calculations on data obtained by a probe with non-uniformly wound detection coil. While non-uniform, the coil winding is specific according to a known and determined function, such as a sinusoidal variation. As a further method, the probe may rotate about an area of interest and the data then may be subjected to a Fourier analysis for further refined results. Multiple coils may be used in the probe, each with a different coil function which could include one uniform coil. Also disclosed is a method for making the coils necessary in the practice of the method.

28 Claims, 6 Drawing Sheets

METHOD FOR NONINVASIVE DETERMINATION OF A DISTRIBUTION OF ELECTRICAL CURRENT AND APPARATUS FOR THE SAME

CROSS REFERENCE TO PRIOR APPLICATION

This application claims the priority of U.S. Provisional Application Ser. No. 60/915,243 filed May 1, 2007 and entitled "STABLE AND ACCURATE NONINVASIVE METHOD FOR DETERMINING THE DISTRIBUTION OF DISCRETE AND/OR CONTINUOUS ELECTRICAL CURRENTS", the entire subject matter of which is incorporated herein by reference.

FIELD OF THE INVENTION

The present invention relates generally to an apparatus for the non-invasive measurement of time-varying electrical currents. More particularly, it relates to an apparatus which surrounds an electrical current and measures the spatial distribution of said current.

DESCRIPTION OF THE PRIOR ART

Noninvasive current measurements are commonly made with ferrous current transformers in which the current is surrounded by a continuous core having a high magnetic permeability. The time-dependent current causes a changing magnetic flux in the core that induces a voltage across a secondary winding that is proportional to the rate of change of the primary current. In clamp-on current transformers the core is split so that it may be opened and then closed to place it around the current without interrupting the current. Ferrous current transformers measure the total time-dependent current that passes through the aperture or window which is surrounded by the continuous core.

Noninvasive current measurements are also made with Rogowski coils, which differ from the ferrous current transformers in that they do not have cores with a high magnetic permeability. Rogowski coils are based on Ampere's law, which states that the line integral of the magnetic field intensity along a closed path is equal to the total current that is surrounded by this path. Thus, when a solenoid having a constant cross-sectional area and a uniform number of turns per unit length is bent to follow a closed path, the voltage that is induced in this coil is proportional to the rate of change of the total current that passes through the area which is enclosed by this path. In prior art considerable emphasis has been placed on means for increasing the uniformity of the winding in Rogowski coils. Saito et al. (U.S. Pat. No. 7,106,162, issued Sep. 12, 2006 and U.S. Pat. No. 6,822,547 issued Nov. 23, 2004), and Kojovic et al. (U.S. Pat. No. 6,313,623 issued Nov. 6, 2001) disclosed the use of printed circuit boards in Rogowski coils to increase the uniformity of the winding. Bosco et al. (U.S. Pat. No. 5,852,395 issued Dec. 22, 1998) disclosed a method of increasing the uniformity of the winding of Rogowski coils by spacing the turns. The intentional use of nonuniform windings in Rogowski coils has not been described in the prior art.

Noninvasive current measurements may also be made by measuring the magnetic field that is caused by electrical currents which are located away from the sensor. Singer et al. (U.S. Pat. No. 6,118,270 issued Sep. 12, 2000 and U.S. Pat. No. 6,043,641 issued Mar. 28, 2000) disclosed how a coil can be used to detect the magnetic field that is caused by an electrical current. However, this method is not as accurate as using ferrous current transformers or Rogowski coils because the measurement is strongly dependent on the location of the current and the three-dimensional configuration of the wire which carries this current. Durand (U.S. Pat. No. 5,767,668 issued Jun. 16, 1998) disclosed how two magnetic field sensors may be used to compute the value of the current and its location when the current is located on a line that intersects the two sensors. However, this method is only suitable for a single current that is known to be on the specific line and it depends on the three-dimensional configuration of the wires that carry this current. The method described herein differs from the prior art in that it utilizes non-ferrous toroidal coils with non-uniform windings (that is, windings where the number of turns per unit length is variable and not constant) to determine valuable electrical current data including distribution, strength and location.

SUMMARY OF THE PRESENT INVENTION

Briefly, current probes that are non-ferrous toroidal coils having windings with a specified type of nonuniformity are used to determine the distribution of electrical current within the aperture or window of the probes. The intentional use of specified nonuniform windings, which is contrary to previous art, causes this new type of current probe to have some sensitivity to nearby currents that are outside of the probe window, which is not the case for ferrous current transformers and Rogowski coils. However, this delimitation does not reduce the usefulness of the present invention in many applications such as: (1) characterizing the profile of a beam of charged particles that passes through the probe window; (2) determining the locations of one or more wires that are within the probe window and the currents that these wires carry; (3) determining the currents at one or more locations within the probe window when these locations are specified, (4) measuring the distribution of electrical current that is induced in an object, such as the human body (e.g. torso, or limbs) by electromagnetic radiation when other parts of the object are not near the outside of the probe, and (5) measuring eddy currents, which would give no reading with ferrous current transformers and Rogowski coils because the current follows loops with zero net axial current.

In particular, the specified nonuniformity of the winding may be accomplished by setting the number of turns per unit length equal to a Fourier series with the arguments $J\theta$, where $\theta$ is the azimuthal coordinate which varies from 0 to $2\pi$ radians around the circular shape of the toroidal coil and the index J is an integer. A group of one or more toroidal coils may be used to implement a truncated Fourier series, where the windings of each coil are made to follow one or more terms of the Fourier series. The toroidal coils with either $\sin(J\theta)$ or $\cos(J\theta)$ may be eliminated by rotating the other coil by an angle which may include $\pi/2$ or $3\pi/2$ radians during the measurements. A system of simultaneous equations is developed that relates the unknown currents and their locations to the voltages that are measured on the toroidal coils, and this system may be solved to determine the currents and/or their locations.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENTS

With reference now to the drawings, the preferred embodiments of the method for determining electrical current distribution is herein described, along with a method of manufacturing the coils necessary for the practice thereof. It should be noted that the articles "a", "an", and "the", as used in this specification, include plural referents unless the content clearly dictates otherwise.

The preferred embodiments are defined by obtaining an expression for the open-circuit voltage that would be induced in the coil by a filament of current at an arbitrary location, and then deriving an expression for this voltage with a winding having a specified nonuniformity.

Figure 1:
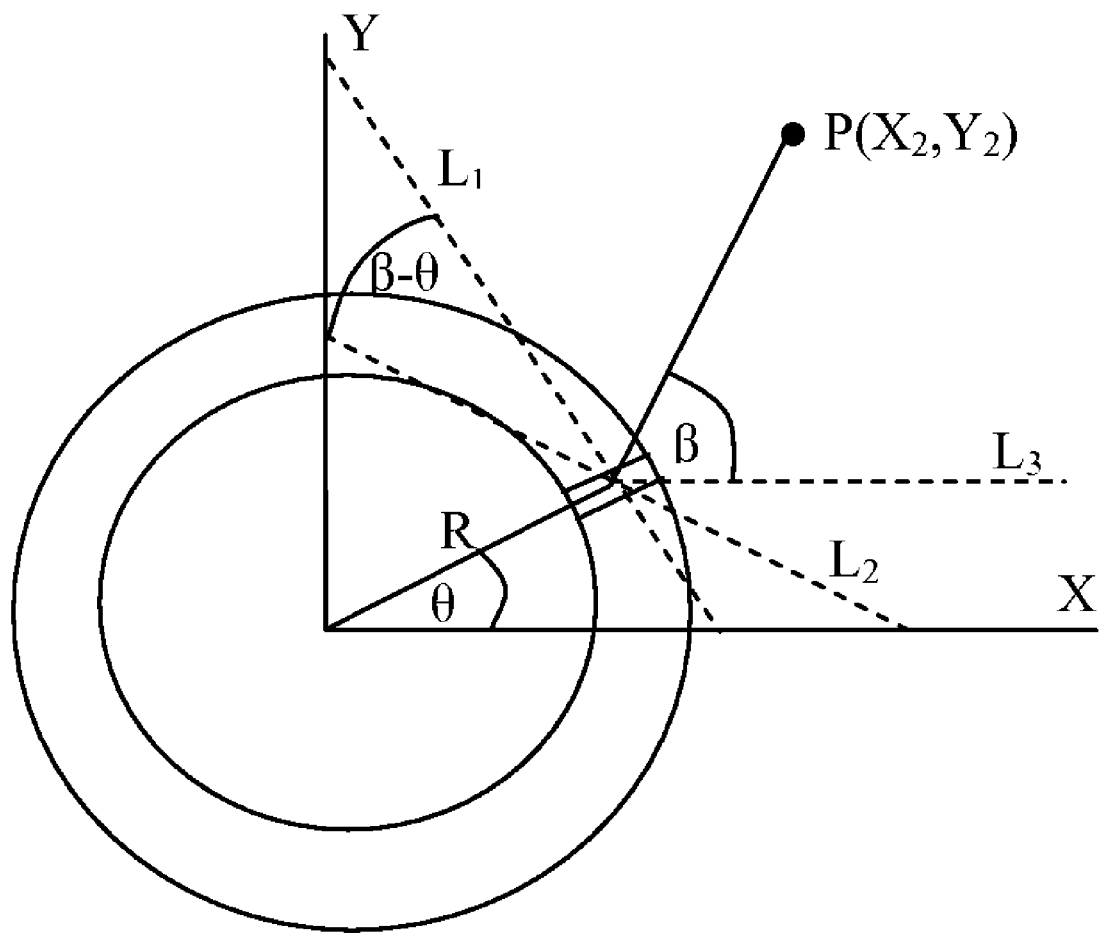
FIG. 1 is a drawing for the analysis of a non-ferrous toroidal coil with a nonuniform winding.

A non-ferrous toroidal coil having a mean radius, defined as the distance from the origin to the center of the winding, of R, is shown in FIG. 1. The winding has a cross-section of arbitrary shape with area A, where $A<<R^2$. This coil differs from a Rogowski coil in that the number of turns per unit length is a variable given by $N'(\theta)$ where $\theta$ is the angular polar coordinate. Given an incremental winding of length $Rd\theta$, centered at the coordinates $(R, \theta)$ or $(X_1, Y_1)$; the number of turns in an increment of the winding given by $dN=N'(\theta)Rd\theta$; the dashed line $L_1$ being directed normal to the incremental winding; dashed line $L_2$ being directed parallel to the magnetic field; and dashed line $L_3$ being parallel to the X-axis; and a filament of current I that intersects the plane at the point $P(X_2,Y_2)$ which may be anywhere in the plane, for a current I having harmonic time variation of $e^{j\omega t}$, Ampere's law requires that the open-circuit voltage that would be induced in the coil is given by the following expression:

$$V_{OC} = -\int_0^{2\pi} \frac{j\omega\mu_0 N'(\theta)RA I\cos(\beta-\theta)d\theta}{2\pi\sqrt{(X_2-X_1)^2+(Y_2-Y_1)^2}} \quad (1)$$

where $\cos((\beta-\theta))$, which is the cosine of the angle between the direction of the magnetic field and the normal to the incremental winding, is given by $$\cos(\beta-\theta) = \frac{(X_2-X_1)\cos\theta}{\sqrt{(X_2-X_1)^2+(Y_2-Y_1)^2}} + \frac{(Y_2-Y_1)\sin\theta}{\sqrt{(X_2-X_1)^2+(Y_2-Y_1)^2}} \quad (2)$$

Thus, substituting Eq. (2) into Eq. (1), the open-circuit voltage is given by $$V_{OC} = j\omega\mu_0 AI \int_0^{2\pi} \frac{N'(\theta)\left[1 - \frac{X_2}{R}\cos\theta - \frac{Y_2}{R}\sin\theta\right]}{\left[\left(\frac{X_2}{R}-\cos\theta\right)^2 + \left(\frac{Y_2}{R}-\sin\theta\right)^2\right]2\pi} d\theta \quad (3)$$

The number of turns per unit length may be written as a Fourier series:

$$N'(\theta) = N'_0 + \sum_{J=1}^{\infty}[N'_{JC}\cos(J\theta) + N'_{JS}\sin(J\theta)] \quad (4)$$

Substituting Eq. (4) into Eq. (3), and evaluating the integral, gives the following expression for the open-circuit voltage, which is a key to this invention:

$$V_{OC} = \quad (5)$$
$$j\omega\mu_0 AIN'_0 + \frac{j\omega\mu_0 AI}{2}\sum_{J=1}^{\infty}\left[N'_{JC}\left(\frac{R_2}{R}\right)^J\cos(J\theta) + N'_{JS}\left(\frac{R_2}{R}\right)^J\sin(J\theta)\right]$$

which, is only valid for $R_2<R$, that is, for currents that are inside of the probe window. For the case where only $N_0'$, $N_{1C}'$ and $N_{1S}'$ are non zero, $$V_{OC} = j\omega\mu_0 AIN'_0 + \frac{j\omega\mu_0 AI}{2R}(N'_{1C}X_2 + N'_{1S}Y_2). \quad (6A)$$

So, if only a single current filament is present, the value of the current and its coordinates could be determined by solving Eq. (6A) as follows:

$$I = \frac{-jV_{OC0}}{\omega\mu_0 AN'_0} \quad (6B)$$

$$X_2 = \frac{2RN'_0 V_{OC1C}}{N'_{1C} V_{OC0}} \quad (6C)$$

$$Y_2 = \frac{2RN'_0 V_{OC1S}}{N'_{1S} V_{OC0}} \quad (6D)$$

Here $V_{OC}=V_{OC0}+V_{OC1C}+V_{OC1S}$, where $V_{OC0}$, $V_{OC1C}$, and $V_{OC1S}$ are the open-circuit voltages measured on the windings with the number of turns per unit length given by $N_0'$, $N_{1C}'\cos(\theta)$, and $N_{1S}'\sin(\theta)$, respectively. This procedure can be generalized to find the location and current for more than one current filament by forming equations analogous to equations 6A, 6B, 6C and 6D.

First Method for M Unknown Currents and Windings for M Terms as a Matrix Solution:

Now, consider the case for M unknown currents and windings for M terms of the Fourier series, where M is an odd integer and the locations of the currents are specified. Thus, the index J goes from 1 to (M−1)/2. For example, the distribution of current within the window may be determined by partitioning the window of the probe into M segments and assigning the total current in each segment to the centroid of that segment. This process could be repeated with different partitions to possibly obtain a more accurate determination of current location. Another application would be to find the current in each of M discrete current filaments when the locations of these filaments are known. For the case of M=3, the matrix equation that relates the currents to the measured voltages may be written as follows:

$$\begin{bmatrix} V_{OC0} \\ V_{OC1C} \\ V_{OC1S} \end{bmatrix} = j\omega\mu_0 A \begin{bmatrix} N_0' & N_0' & N_0' \\ \frac{N_{1C}'}{2}\left(\frac{R_1}{R}\right)\cos(\theta_1) & \frac{N_{1C}'}{2}\left(\frac{R_2}{R}\right)\cos(\theta_2) & \frac{N_{1C}'}{2}\left(\frac{R_3}{R}\right)\cos(\theta_3) \\ \frac{N_{1S}'}{2}\left(\frac{R_1}{R}\right)\sin(\theta_1) & \frac{N_{1S}'}{2}\left(\frac{R_2}{R}\right)\sin(\theta_2) & \frac{N_{1S}'}{2}\left(\frac{R_3}{R}\right)\sin(\theta_3) \end{bmatrix} \begin{bmatrix} I_1 \\ I_2 \\ I_3 \end{bmatrix} \quad (7)$$

More generally, for M equal to an odd integer, this system of equations may be represented as follows:

$$V_{OCI} = j\omega\mu_0 A N_0' \sum_{J=1}^{M} I_J \text{ for } I = 1 \quad (8A)$$

$$V_{OCIC} = j\omega\mu_0 A \frac{N_{I/2,C}'}{2} \sum_{J=1}^{M} \left(\frac{R_J}{R}\right)^{I/2} \cos\left[\frac{I\theta_J}{2}\right] I_J \quad (8B)$$

for $I = 2, 4, 6, \ldots M-1$ $$V_{OCIS} = j\omega\mu_0 A \frac{N_{(I-1)/2,S}'}{2} \sum_{J=1}^{M} \left(\frac{R_J}{R}\right)^{(I-1)/2} \sin\left[\frac{(I-1)\theta_J}{2}\right] I_J \quad (8C)$$

for $I = 3, 5, 7, \ldots M$

The errors in solving an inverse problem are frequently much greater than those in solving the forward problem because of what is called "ill-conditioning" of the matrix. The condition numbers for the matrix that is defined by Eqs. (8A), (8B), (8C) have been determined using the Frobenius norm, and they represent the ratio of the upper bound on the norm of the fractional errors in the calculated currents to the norm of the fractional errors in the measured voltages.

Figure 2:
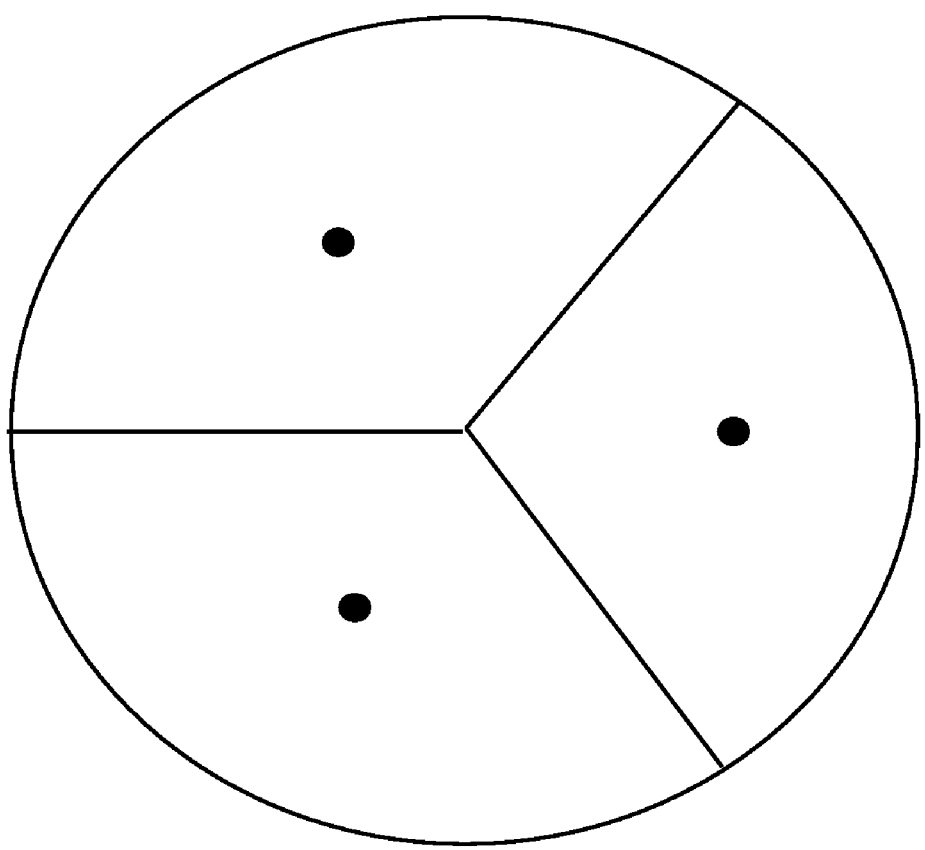
FIG. 2 is a drawing showing a circular probe window with current filaments evenly spaced on a circle as in Example 1 with M=3.

Table 1 gives the values of the condition numbers for the matrix in Example 1 (FIG. 2) when M current filaments are evenly spaced on a circle with radius $R_J=R/2$. The condition number that is not optimized is for the case that all of the $N_{IC}'=N_{IS'=N0}'$. The condition number has a minimum value that is equal to M, which occurs when $N_{IC}'/N_0'=N_{IS}'/N_0'=3(R/R_J)^I$ for all values of the index I. For example, with $R_J=R/2$ and M=7, the condition number is equal to 38.1 for $N_{3C}'=N_{3S}'=N_{2C}'=N_{2S}'=N_{1C}'=N_{1S}'=N_0'$, and 7 for $N_{3C}'=N_{3S}'=24N_0'$, $N_{2C}'=N_{2S}'=12N_0'$, and $N_{1C}'=N_{1S}'=6N_0'$.

TABLE 1

Condition numbers for M current filaments on a circle with a radius of R/2

| M, number of currents | Condition number minimum | Condition number not optimized |
|---|---|---|
| 3 | 3 | 8.3 |
| 5 | 5 | 18.6 |
| 7 | 7 | 38.1 |
| 9 | 9 | 76.8 |
| 11 | 11 | 153.8 |
| 13 | 13 | 307.6 |
| 15 | 15 | 615.3 |
| M | M | $2.4 \times 2^{(M+1)/2}$ |

Figure 3:
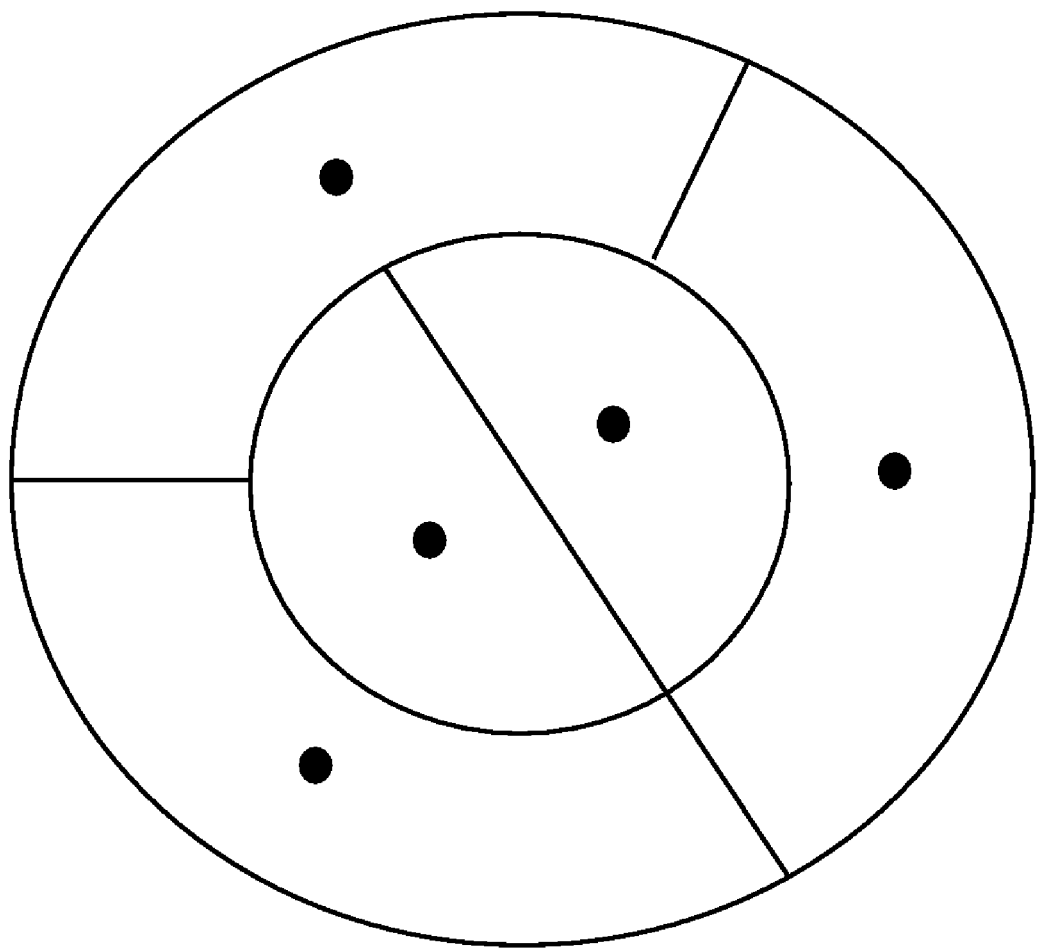
FIG. 3 is a drawing showing a circular probe window partitioned into 5 segments as in Example 2.

Table 2 gives the polar coordinates of the centroids for each segment in Example 2 (FIG. 3), where the circular probe window is partitioned into five segments. This area is divided into a central circle with an outer ring. The circle and the ring are divided into two and three segments, respectively, to form a total of five segments that have equal area. For this example the matrix has a condition number of 76.6 for $N_{2C}'=N_{2S}'=N_{1C}'=N_{1S}'=N_0'$, and 23.8 for $N_{2C}'=N_{2S}'=15N_0'$, and $N_{1C}'=N_{1S}'=10N_0'$.

TABLE 2

Coordinates of the centroids in Example 2.

| Segment | $R_J/R$ | $\theta_J$ |
|---|---|---|
| 1 | 0.268 | 30° |
| 2 | 0.268 | 210° |
| 3 | 0.686 | 0° |
| 4 | 0.686 | 120° |
| 5 | 0.686 | 240° |

Figure 4:
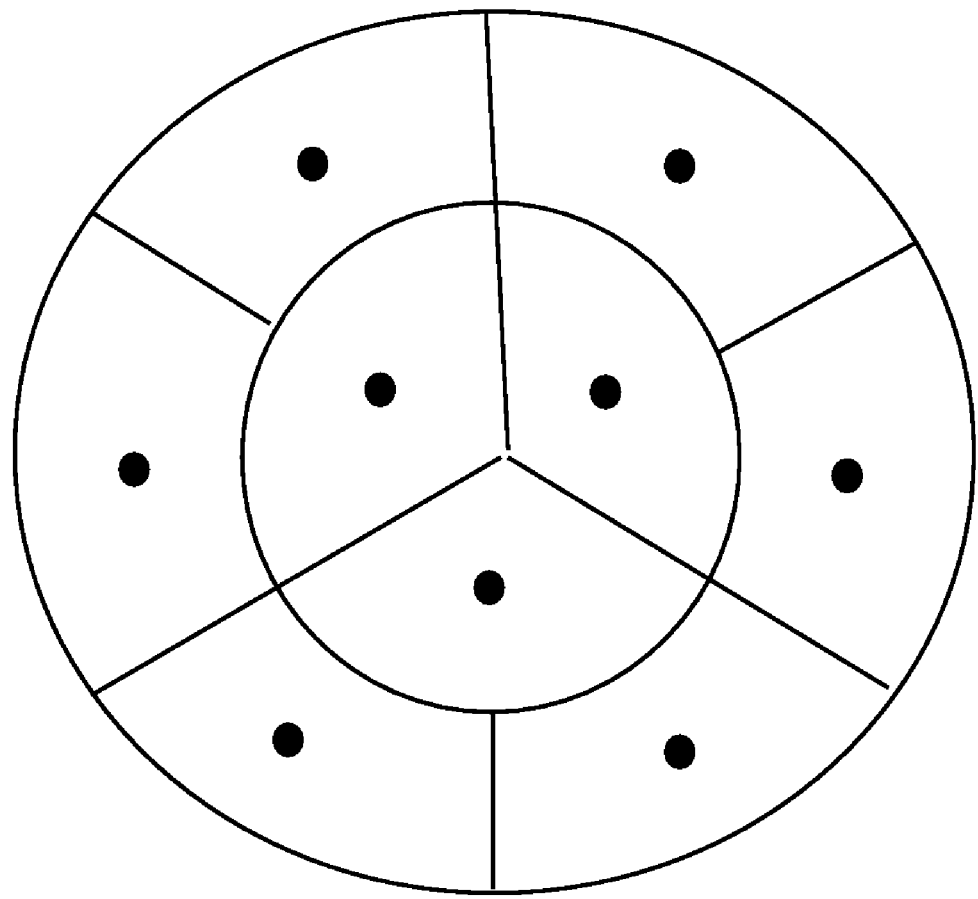
FIG. 4 is a drawing showing a circular probe window partitioned into 9 segments as in Example 3.

Table 3 gives the polar coordinates of the centroids for each segment in Example 3 (FIG. 4), where the circular probe window is partitioned into nine segments. This area is divided into a central circle with an outer ring. The circle and the ring are divided into three and six segments, respectively, to form a total of nine segments that have equal area. For this example we find that the matrix has a condition number of 155 for $N_{4C}'=N_{4S}'=N_{3C}'=N_{3S}'=N_{2C}'=N_{2S}'=N_{1C}'=N_{1S}'=N_0'$, and 46.4 for $N_{4C}'=N_{4S}'=23N_0'$, $N_{3C}'=N_{3S}'=22N_0'$, $N_{2C}'=N_{2S}'=13N_0'$, and $N_{1C}'=N_{1S}'=4N_0'$.

TABLE 3

Coordinates of the centroids in Example 3.

| Segment | $R_J/R$ | $\theta_J$ |
|---|---|---|
| 1 | 0.349 | 30° |
| 2 | 0.349 | 150° |
| 3 | 0.349 | 270° |
| 4 | 0.771 | 0° |
| 5 | 0.771 | 60° |
| 6 | 0.771 | 120° |
| 7 | 0.771 | 180° |
| 8 | 0.771 | 240° |
| 9 | 0.771 | 300° |

Second Method for M Currents and Windings for M Terms as a Matrix Solution:

It is also possible to rotate a single non-ferrous toroidal coil with a nonuniform winding, or a group of non-ferrous toroidal coils and use Fourier analysis of the measurement data to determine the currents. In this case the single coil or group of coils will implement M=2N+1 terms of a truncated Fourier series so that $$N'(\theta) = N'_0 + \sum_{J=1}^{N} [N'_{JC}\cos(J\theta) + N'_{JS}\sin(J\theta)] \quad (9)$$

If a group of M currents are located within the probe window, and the open-circuit voltage is measured as the coil or coils are rotated to different angles relative to these currents, a Fourier analysis of the data that are obtained with this single coil may be made to determine the parameters $A_0$, $A_{IC}$ and $A_{IS}$ such that $$V_{OC}(\alpha) = \frac{A_0}{2} + \sum_{I=1}^{N} [A_{IC}\cos(I\alpha) + A_{IS}\sin(I\alpha)] \quad (10)$$

where $\alpha$ is the angle by which the probe is rotated. But Eq. (5) requires that the open-circuit voltage is related to the values of the M currents and their coordinates by the following expression when there is no rotation:

$$V_{OC}|_{\alpha=0} = j\omega\mu_0 A N'_0 \sum_{I=1}^{N} I_I + \frac{j\omega\mu_0 A}{2} \quad (11)$$

$$\sum_{J=1}^{N} \left[ N'_{JC} \sum_{I=1}^{N} \left(\frac{R_I}{R}\right)^J \cos(J\theta_I) I_I + N'_{JS} \sum_{I=1}^{N} \left(\frac{R_I}{R}\right)^J \sin(J\theta_I) I_I \right]$$

Thus, as the probe is rotated by an angle of a, Eq. (11) may be generalized to give the following:

$$V_{OC}(\alpha) = \quad (12)$$

$$j\omega\mu_0 A N'_0 \sum_{I=1}^{N} I_I + \frac{j\omega\mu_0 A}{2} \sum_{J=1}^{N} \left[ N'_{JC} \sum_{I=1}^{N} \left(\frac{R_I}{R}\right)^J \cos(J\theta_I + J\alpha) I_I + \right.$$

$$\left. N'_{JS} \sum_{I=1}^{N} \left(\frac{R_I}{R}\right)^J \sin(J\theta_I + J\alpha) I_I \right]$$

Equating the two expressions for the open-circuit voltage in Eqs. (10) and (12) gives the following equation:

$$\frac{A_0}{2} + \sum_{I=1}^{N} [A_{IC}\cos(I\alpha) + A_{IS}\sin(I\alpha)] = \quad (13)$$

$$j\omega\mu_0 A N'_0 \sum_{I=1}^{N} I_I + \frac{j\omega\mu_0 A}{2} \sum_{J=1}^{N} \left[ N'_{JC} \sum_{I=1}^{N} \left(\frac{R_I}{R}\right)^J \cos(J\theta_I + J\alpha) I_I + \right.$$

$$\left. N'_{JS} \sum_{I=1}^{N} \left(\frac{R_I}{R}\right)^J \sin(J\theta_I + J\alpha) I_I \right]$$

But Eq. (13) is as an identity in $\alpha$, so using expressions for the cosine and sine of the sum of two angles gives the following expressions:

$$\sum_{I=1}^{N} I_I = \frac{-jA_0}{2\omega\mu_0 A N'_0} \quad (14A)$$

$$\left[ \sum_{I=1}^{N} \left(\frac{R_I}{R}\right)^J [N'_{JC}\cos(J\theta_I) + N'_{JS}\sin(J\theta_I)] I_I \right] = \frac{-2jA_{JC}}{\omega\mu_0 A} \quad (14B)$$

for $J = 1$ to $N$ $$\left[ \sum_{I=1}^{N} \left(\frac{R_I}{R}\right)^J [N'_{JS}\cos(J\theta_I) - N'_{JC}\sin(J\theta_I)] I_I \right] = \frac{-2jA_{JS}}{\omega\mu_0 A} \quad (14C)$$

for $J = 1$ to $N$

Equations (14A), (14B) and (14C) define a system of equations that may be used to determine M=2N+1 currents when the coordinates for these currents are specified. For discrete currents such as in wires it is necessary to specify the locations of the current filaments. When it is necessary to determine a continuous distribution of current the area of the probe window must be partitioned into segments, the coordinates of the centroids of these segments are specified, and the current at each centroid is determined to represent the current in the corresponding segment.

For the case of M=3, the matrix equation that relates the currents to the Fourier coefficients is as follows:

$$\begin{bmatrix} A_0 \\ A_{1C} \\ A_{1S} \end{bmatrix} = j\omega\mu_0 A \begin{bmatrix} 2N'_0 & 2N'_0 & 2N'_0 \\ \left(\frac{R_1}{2R}\right)[N'_{1C}\cos(\theta_1) + N'_{1S}\sin(\theta_1)] & \left(\frac{R_2}{2R}\right)[N'_{1C}\cos(\theta_2) + N'_{1S}\sin(\theta_2)] & \left(\frac{R_3}{2R}\right)[N'_{1C}\cos(\theta_3) + N'_{1S}\sin(\theta_3)] \\ \left(\frac{R_1}{2R}\right)[N'_{1S}\cos(\theta_1) - N'_{1C}\sin(\theta_1)] & \left(\frac{R_2}{2R}\right)[N'_{1S}\cos(\theta_2) - N'_{1C}\sin(\theta_2)] & \left(\frac{R_3}{2R}\right)[N'_{1S}\cos(\theta_3) + N'_{1C}\sin(\theta_3)] \end{bmatrix} \begin{bmatrix} I_1 \\ I_2 \\ I_3 \end{bmatrix} \quad (15)$$

More generally, for M equal to an odd integer, this system of equations may be represented as follows:

$$A_0 = 2j\omega\mu_0 A N_0' \sum_{J=1}^{M} I_J \text{ for } I = 1 \quad (16A)$$

$$A_{JC} = \frac{j\omega\mu_0 A}{2} \sum_{J=1}^{M} \left(\frac{R_J}{R}\right)^{I/2} \left[N'_{I/2,C}\cos\left(\frac{I\theta_J}{2}\right) + N'_{I/2,S}\sin\left(\frac{I\theta_J}{2}\right)\right] I_J \quad (16B)$$

$$\text{for } I = 2, 4, 6, \ldots M - 1$$

$$A_{JS} = \frac{j\omega\mu_0 A}{2} \sum_{J=1}^{M} \left(\frac{R_J}{R}\right)^{(I-1)/2} \left[N'_{(I-1)/2,S}\cos\left(\frac{(I-1)\theta_J}{2}\right) - N'_{(I-1)/2,C}\sin\left(\frac{(I-1)\theta_J}{2}\right)\right] I_J \quad (16C)$$

$$\text{for } I = 3, 5, 7, \ldots M$$

It has already been mentioned that the errors in solving an inverse problem are frequently much greater than those in solving the forward problem because of what is called "ill-conditioning" of the matrix, and the condition numbers for the matrices have been given in several examples. Ultimately, the condition number and the errors in the measurements determine the errors in the calculated currents. This, the second method, has greater accuracy and may be used with a larger number of currents. This is because many measurements of the voltage may be made at different angles of rotation, and used to evaluate the integrals that are required to determine the Fourier coefficients. The "smoothing property of the integral operator", which may be understood in terms of averaging, causes the error in a numerical integration to be less than the error in the data for the integrand, and this causes the greater accuracy of the second method.

Figure 5:
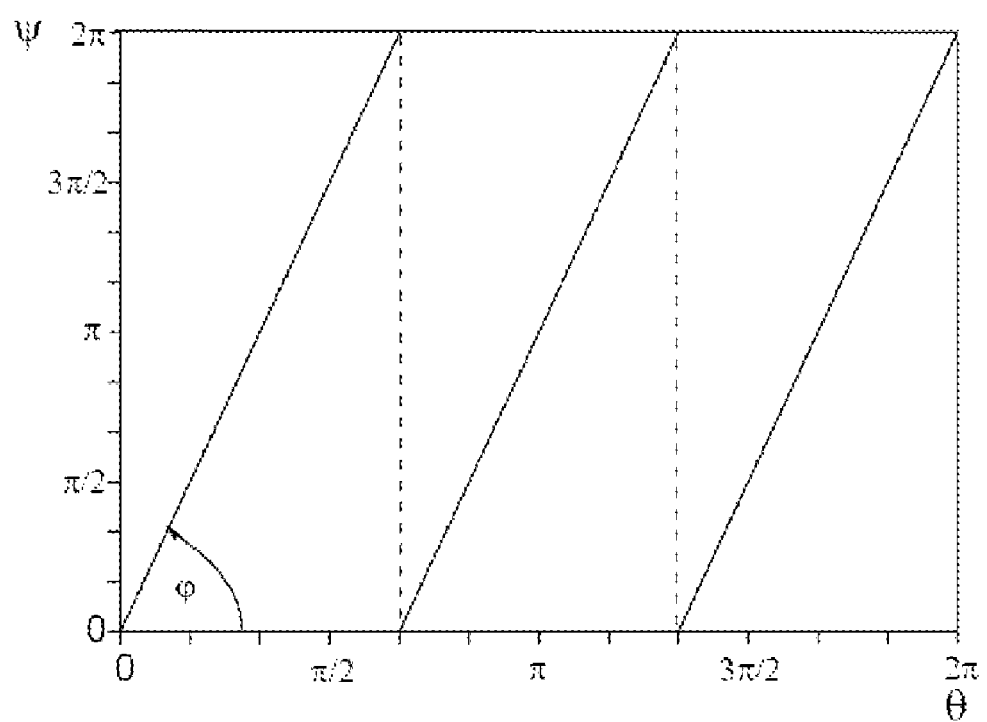
FIG. 5 is a projection of the surface of a toroid according to the prior art.

Method for Making the Toroidal Coils:

It is possible to make a current probe that implements one or more of the terms in Eq. (4) by using separate coils for each term, or a single coil may be made implementing two or more of these terms. Two different angular coordinates must be used to specify locations on the surface of the toroid. The angle θ has been defined as the azimuthal coordinate which varies from 0 to 2π radians when making one complete trip following the tube around the toroidal coil at a fixed distance from the origin. The angle ψ is defined as the coordinate which varies from 0 to 2π radians when making one complete trip around the tube of the toroid at a fixed value of θ. FIG. 5 is a projection of the surface of the toroid on to a flat surface. This figure also shows three straight lines which represent the individual turns (N=3) of a uniformly-wound toroid, where the angle φ must satisfy the relationship $$\tan(\phi) = N = 2\pi R N_0' \quad (17)$$

More generally, for a non-uniform winding, the lines that the turns follow on this projection are not straight, and the slope satisfies the following equation:

$$\frac{d\psi}{d\theta} = 2\pi R N'(\theta) \quad (18)$$

Using Eq. (4) for the number of turns per unit length of the winding, $$\frac{d\psi}{d\theta} = 2\pi R N_0' + 2\pi R \sum_{J=1}^{\infty} [N'_{JC}\cos(J\theta) + N'_{JS}\sin(J\theta)] \quad (19)$$

The full Fourier series is written in Eq. (19) but only the terms from this series which are implemented should be used. Note that the winding reverses in direction at the values of θ for which N'(θ)=0. Equation (19) is integrated to obtain the following equation for the path of each turn:

$$\psi = 2\pi R N_0'\theta + 2\pi R \sum_{J=1}^{\infty} \left[\frac{N'_{JC}}{J}\sin(J\theta) - \frac{N'_{JS}}{J}\cos(J\theta)\right] + C \quad (20)$$

where C is a constant of integration. The procedure for determining the path of each turn of the toroidal coil is as follows:
(1) Begin the first turn at the origin (θ=0, ψ=0) and follow Eq. (20) with C=0 until the end of this turn is reached when ψ=2π radians. Define $\theta_1$ as the value of θ at this end point.
(2) Begin the second turn at θ=$\theta_1$, ψ=0 and follow Eq. (20) with the constant C equal to −2π radians.

Continue until the end of this turn is reached when ψ=2π radians. Define $\theta_2$ as the value of θ at this end point.
(3) Continue this process until θ=2π, and then scale all of the values of θ so that the number of turns is an integer.

Figure 6:
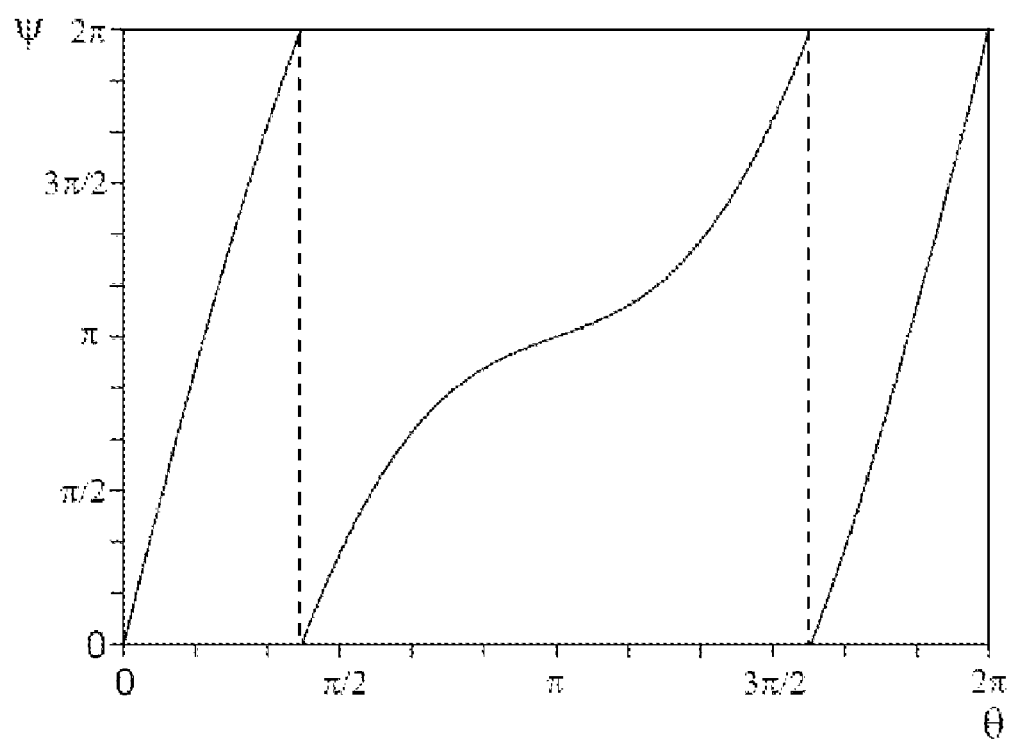
FIG. 6 is a projection of the surface of a toroid according to the present invention.

FIG. 6 shows the projection of the coil on the surface of the toroid for a nonuniform winding, as determined by the process that has just been defined, for the case that only $N_0'$ and $N_{1C}'$ are non-zero, so that N'(θ)=$N_0'$+$N_{1C}'$ cos(θ). For the purposes of this example the two coefficients have been chosen such that $N_0'$=3/(2πR), and $N_{1C}'$=2.5/(2πR).

While the example above only utilizes two terms (a constant and a sinusoidal), it is possible to use the method described to develop a coils with only one term, three terms, or more. By rotating a coil following the example above, it is possible to derive three terms. One winding may implement as many terms as a user desires and the above example is intended to illustrate the method and not be entirely dispositive.

When building a probe utilizing more than one coil, it is best to keep each coil on a separate circuit, having one active at a time, so as to eliminate potential interference while one coil is used for measurements. In some instances, it may be beneficial to utilize a uniformly wound coil with at least one nonuniformly wound coil, as uniform coils are useful to determine the value of constants, like current.

Scope of Method

The method of determining electrical current distribution has a number of practical applications other than abstract determination. As an example, the method may be used in medical examination and monitoring situations by dividing a region of the body into sections having known external significance (i.e. bone, muscle, fat) and measuring electrical current distribution. In diagnosis, electrical current distribution may be compared to a baseline normal situation to determine variance and alert a doctor to need for further testing. In a monitoring situation, changes can be detected in the distribution of electrical currents in some area of the body and cause an alert for further investigation. An example of using the method in this manner would be monitoring a patient for pulmonary edema. Electrical current distribution will be altered as liquid fills lungs in a pulmonary edema situation. A monitoring system that divides the chest cavity into four, or more, regions and periodically measures current distribution can not only alert doctors to a potentially life threatening situation, but help a doctor locate where the edema is occurring in its early stages. This is but a short list of examples of use in the medical field, as any diagnosis which could be made by changes or measuring electrical current distribution would be benefitted by this method. Use outside the medical field is also contemplated and reasonably easy to foresee. All of these uses are to be understood to merely be practical application of this method and are considered a part of this invention.

Although the present invention has been described with reference to preferred embodiments, numerous modifications and variations can be made and still the result will come within the scope of the invention. No limitation with respect to the specific embodiments disclosed herein is intended or should be inferred.

I claim:

1. A method for non-invasive determination of electrical current distribution comprising:
   a. inducing an open circuit voltage in a probe having at least one non-ferrous toroidal core about which is a coil having specified non-uniform windings, said toroidal core defining an interior probe window;
   b. measuring said open circuit voltage generated when the probe is proximate a particular region, said particular region being defined by the interior probe window; and
   c. mathematically analyzing the measured open circuit voltage to determine current distribution, including current and location of current within the particular region.

2. The method of claim 1, where the step of mathematically analyzing the measured open circuit voltage involves a matrix analysis.

3. The method of claim 1, where the windings of the at least one coil vary according to a sinusoidal function.

4. The method of claim 1, further comprising the step of rotating the probe about the locations of currents and utilizing a Fourier analysis to analyze the measured open current voltage.

5. The method of claim 4, where the windings of the at least one coil vary according to a sinusoidal function.

6. A method for non-invasive determination of electrical current distribution comprising:
   a. inducing an open circuit voltage in a probe having at least one non-ferrous toroidal core about which is a coil having specified non-uniform windings, said toroidal core defining an interior probe window;
   b. measuring said open circuit voltage generated when the probe is proximate a particular region, said particular region being defined by the interior probe window; and
   c. mathematically analyzing the measured open circuit voltage to determine current distribution within the particular region.

7. The method of claim 6, currents within the particular region having known locations and said locations being given mathematical significance in the step of mathematically analyzing the measured open circuit voltage.

8. The method of claim 7, where the step of mathematically analyzing the measured open circuit voltage involves a matrix analysis.

9. The method of claim 7, where the non-uniform windings of the at least one coil vary according to a sinusoidal function.

10. The method of claim 7, further comprising the step of rotating the probe about the locations of currents and utilizing a Fourier analysis to analyze the measured open current voltage.

11. The method of claim 10, where the windings of the at least one coil vary according to a sinusoidal function.

12. The method of claim 7, further comprising the step of repeating the method periodically to monitor changes in electrical current distribution over time.

13. The method of claim 6, further comprising the step of dividing the particular region into component regions and assigning a hypothetical current location at a centroid of each component region, such hypothetical current locations being given mathematical significance in the step of mathematically analyzing the measured open circuit voltage.

14. The method of claim 13, where the step of mathematically analyzing the measured open circuit voltage involves a matrix analysis.

15. The method of claim 13, where the non-uniform windings of the at least one coil vary according to a sinusoidal function.

16. The method of claim 13, further comprising the step of rotating the probe about the locations of currents and utilizing a Fourier analysis to analyze the measured open current voltage.

17. The method of claim 16, where the non-uniform windings of the at least one coil vary according to a sinusoidal function.

18. The method of claim 13, further comprising the step of repeating the method periodically, using the same component regions, to monitor changes in electrical current distribution over time.

19. The method of claim 13, further comprising the step of repeating the method while dividing the particular region into different component regions with different centroids so as to obtain a more accurate determination of electrical current distribution.

20. A probe head for a probe to be used for determining electrical current distribution to perform the method according to claim 6 comprising:
   at least one non-ferrous toroidal core; and a coil wound about said toroidal core having a specified non-uniform winding.

21. The probe head of claim 20, the winding varying according to a sinusoidal function.

22. The probe head of claim 20 comprising at least two non-ferrous toroidal cores and associated coils having specified non-uniform windings.

23. The probe head of claim 22, the specified non-uniform windings of each coil varying according to different functions with respect to each other.

24. The probe head of claim 22, the winding of a first coil varying according to a sinusoidal function and the winding of a second coil varying according to a sinusoidal function offset at a multiple of $N\pi/2$ radians from the first coil, N being an odd integer.

25. The probe head of claim 22, wherein each coil is individually connected to a measuring circuit such that independent operation of said coils may be achieved.

26. The probe head of claim 25, the specified non-uniform windings of each coil varying according to different functions with respect to each other.

27. The probe head of claim 25, the winding of a first coil varying according to a sinusoidal function and the winding of a second coil varying according to a sinusoidal function offset at a multiple of $N\pi/2$ radians from the first coil, N being an odd integer.

28. The probe head of claim 20, also comprising a non-ferrous core with a uniform coil.

* * * * *